United States Patent
Shen et al.

(10) Patent No.: US 6,750,703 B1
(45) Date of Patent: Jun. 15, 2004

(54) DC OFFSET CANCELING CIRCUIT APPLIED IN A VARIABLE GAIN AMPLIFIER

(75) Inventors: Wei-Chen Shen, Hsinchu (TW); Sheng-Yeh Lai, Taichung (TW)

(73) Assignee: Silicon Integrated Systems Corp., Hsin chu (TW)

( * ) Notice: Subject to any disclaimer, the term of this patent is extended or adjusted under 35 U.S.C. 154(b) by 0 days.

(21) Appl. No.: 10/327,473

(22) Filed: Dec. 24, 2002

(51) Int. Cl.[7] .............................................. H03F 1/02
(52) U.S. Cl. ............................. 330/9; 330/69; 327/124
(58) Field of Search ............................ 330/9, 69, 51; 327/124, 307

(56) References Cited

U.S. PATENT DOCUMENTS

| | | | | |
|---|---|---|---|---|
| 5,206,602 A | * | 4/1993 | Baumgartner et al. | 330/9 |
| 5,293,169 A | * | 3/1994 | Baumgartner et al. | 341/172 |
| 6,262,626 B1 | * | 7/2001 | Bakker et al. | 330/9 |
| 6,407,630 B1 | | 6/2002 | Yao et al. | |

\* cited by examiner

*Primary Examiner*—Henry Choe
(74) *Attorney, Agent, or Firm*—Birch, Stewart, Kolasch & Birch, LLP

(57) ABSTRACT

A DC offset canceling circuit. The DC offset canceling circuit applied in a variable gain amplifier includes chopper circuits, a transconductance amplifier, and at least one internal capacitor. The transconductance amplifier and at least one capacitor function as a filter for canceling DC offset of the variable gain amplifier. A first chopper circuit is inserted between the output of the variable gain amplifier and the input of the transconductance amplifier. A second chopper circuit is inserted between the output of the transconductance amplifier and the capacitor. The DC offset and low frequency noise of the transconductance amplifier, the undesired signal, is translated up to a chopping frequency by chopper circuits. The chopping frequency is much higher than the desired signal bandwidth, and the amount of the undesired signal in the passband of the signal is thereby greatly reduced.

4 Claims, 9 Drawing Sheets

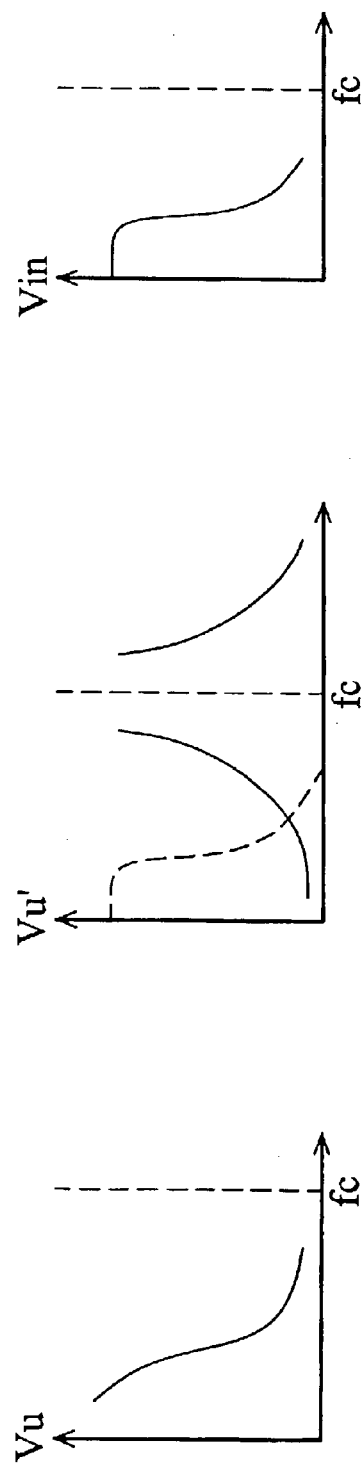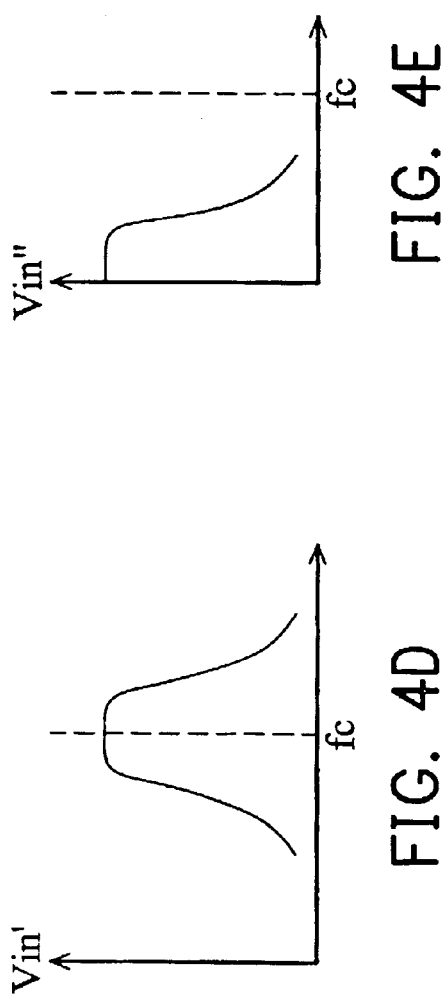

DC OFFSET CANCELING CIRCUIT APPLIED IN A VARIABLE GAIN AMPLIFIER

BACKGROUND OF THE INVENTION

1. Field of the Invention

The present invention relates to a DC offset canceling circuit applied in a variable gain amplifier, and particularly to a DC offset canceling circuit which utilizes a chopper stabilization method to cancel DC offset of output stage.

2. Description of the Related Art

Variable gain amplifiers (VGA), which amplify input signal to necessary voltage levels in a system in demodulation process, are widely used in home network transceivers which transmit signals via cable. When the variable gain amplifier is used, a differential input end of an internal operational amplifier has the problem of intrinsic offset, and the intrinsic offset is always in the range of several mV to tens of mV. For wireless or wired communication, the maximum gain of variable gain amplification is up to tens of dE; therefore, the intrinsic offset after amplification will affect the recovery ability of the received signal, the characteristics of parameters of a dynamic range, and signal-to-noise ratio.

A DC offset canceling circuit is shown in FIG. 1, disclosed by Yao et al., in "DC offset canceling circuit applied in a variable gain amplifier" U.S. Pat. No. 6,407,630 B1. In FIG. 1, a DC offset circuit 26 applied in a variable gain amplifier 25. The variable gain amplifier 25 includes a first amplifier 21, a second amplifier 22, a plurality of switches 201~208, and a plurality of resistors. The DC offset canceling circuit 26 includes a transconductance amplifier 23 and at least one internal capacitor 24. The switches 201~204 adjust the variable gain of the first amplifier 21. For example, if the switch 201 is closed, the gain is raised; and if the switch 202 is closed, the gain is reduced. The switches 205~208 adjust the variable gain of the first amplifier 22. For example, if the switch 205 is closed, the gain is raised; and if the switch 207 is closed, the gain is reduced. The transconductance amplifier 23 is used to transform the output voltage of the second amplifier 22 to an output current based on a ratio.

The output of the transconductance amplifier 23 is coupled to at least one internal capacitor 24, and is then fed back to the input of the first amplifier 21 to cancel the DC offset-of the variable gain amplifier 25. The transconductance amplifier 23 cooperates with the internal capacitor 24, only about 10 pF or even under 10 pF, as a Gm-C filter. Since the capacitance of the internal capacitor 24 is small, the internal capacitor 24 can be manufactured easily inside an IC, and does not occupy I/O pin.

The DC offset of the first amplifier 21 and the second amplifier 22 is canceled by the transconductance amplifier 23 and capacitor 24, the Gm-C filter, but the DC offset of the transconductance amplifier 23 is not. There is a need for a novel canceling circuit to cancel the DC offset of the final stage.

According to the prior art, an extremely large chip area is required for implementing the transconductance amplifier so as to reduce the DC offset. However, the DC offset can be reduced by a chopper to saving the chip area according to the present invention described as follows.

SUMMARY OF THE INVENTION

It is therefore an object of the present invention to provide a DC offset canceling circuit of a variable gain amplifier.

To achieve the above objects, the present invention provides a DC offset canceling circuit including a transconductance amplifier, at least one internal capacitor, and chopper circuits.

A first chopper circuit 30 is inserted between the output of the variable gain amplifier and the input of the transconductance amplifier. A second chopper circuit is inserted between the output of the transconductance amplifier and the capacitor. The first chopper circuit and the second chopper circuit are controlled by a non-overlap clock signal having a chopping frequency. The first chopper circuit can be merged into the input of transconductance amplifier. The second chopper circuit can be merged into the output of transconductance amplifier.

The DC offset and low frequency noise of the transconductance amplifier, the undesired signal, is translated up to the chopping frequency. The spectrum of the undesired signal is folded back around the chopping frequency. The chopping frequency is much higher than the desired signal bandwidth, thus the size of the undesired signal in the passband of the signal is greatly reduced.

Being chopper-stabilized, the transconductance amplifier and capacitor serve the same function, canceling the DC offset of the variable gain amplifier. The chopper circuit cancels the DC offset of the transconductance amplifier.

BRIEF DESCRIPTION OF THE DRAWINGS

The aforementioned objects, features and advantages of this invention will become apparent by referring to the following detailed description of the preferred embodiment with reference to the accompanying drawings, wherein:

FIGS. 4A~4D show the spectra of the desired and undesired signals.

DETAILED DESCRIPTION OF THE INVENTION

Figure 1:
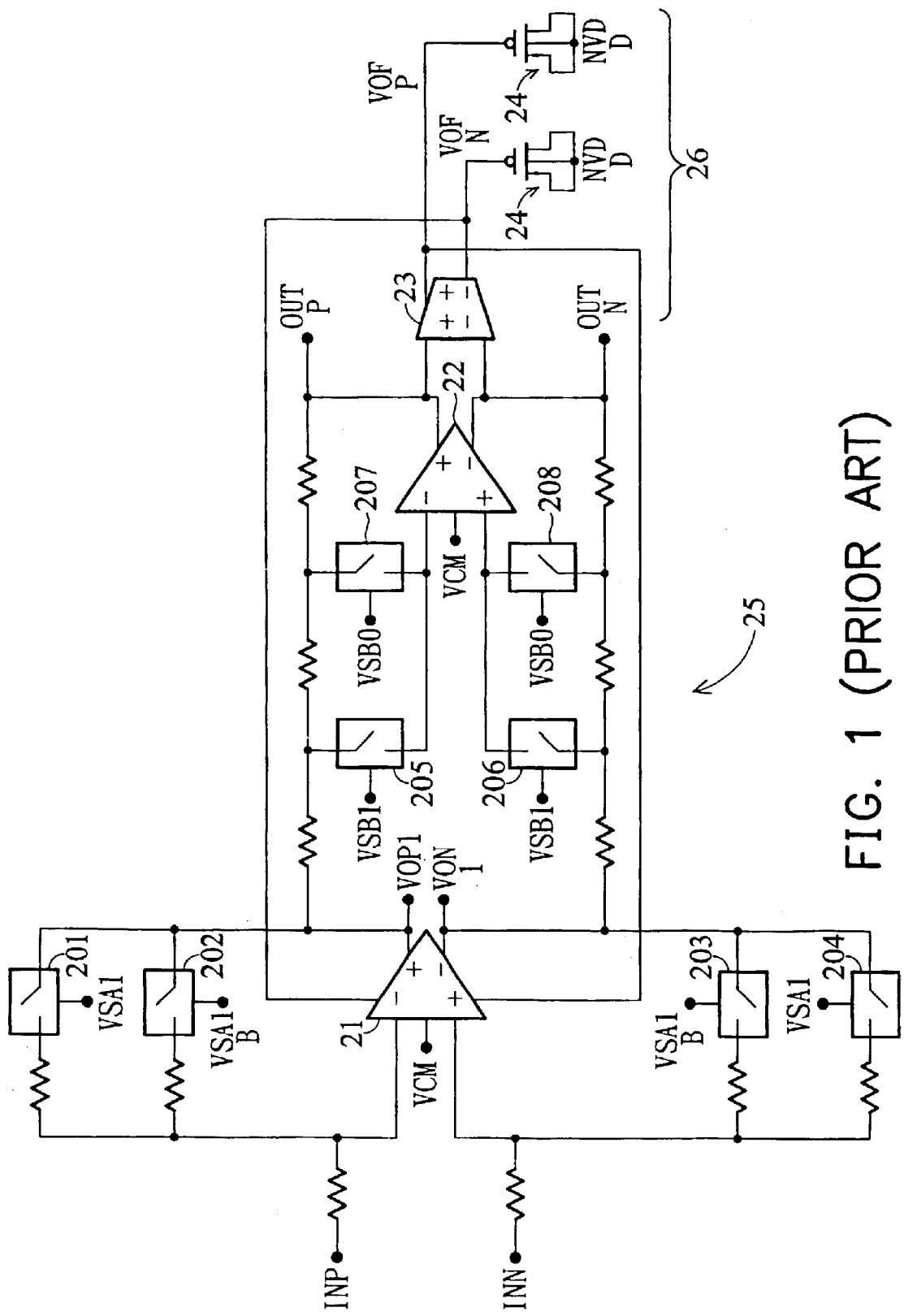
FIG. 1 shows a DC offset canceling circuit in the prior art.
Figure 2:
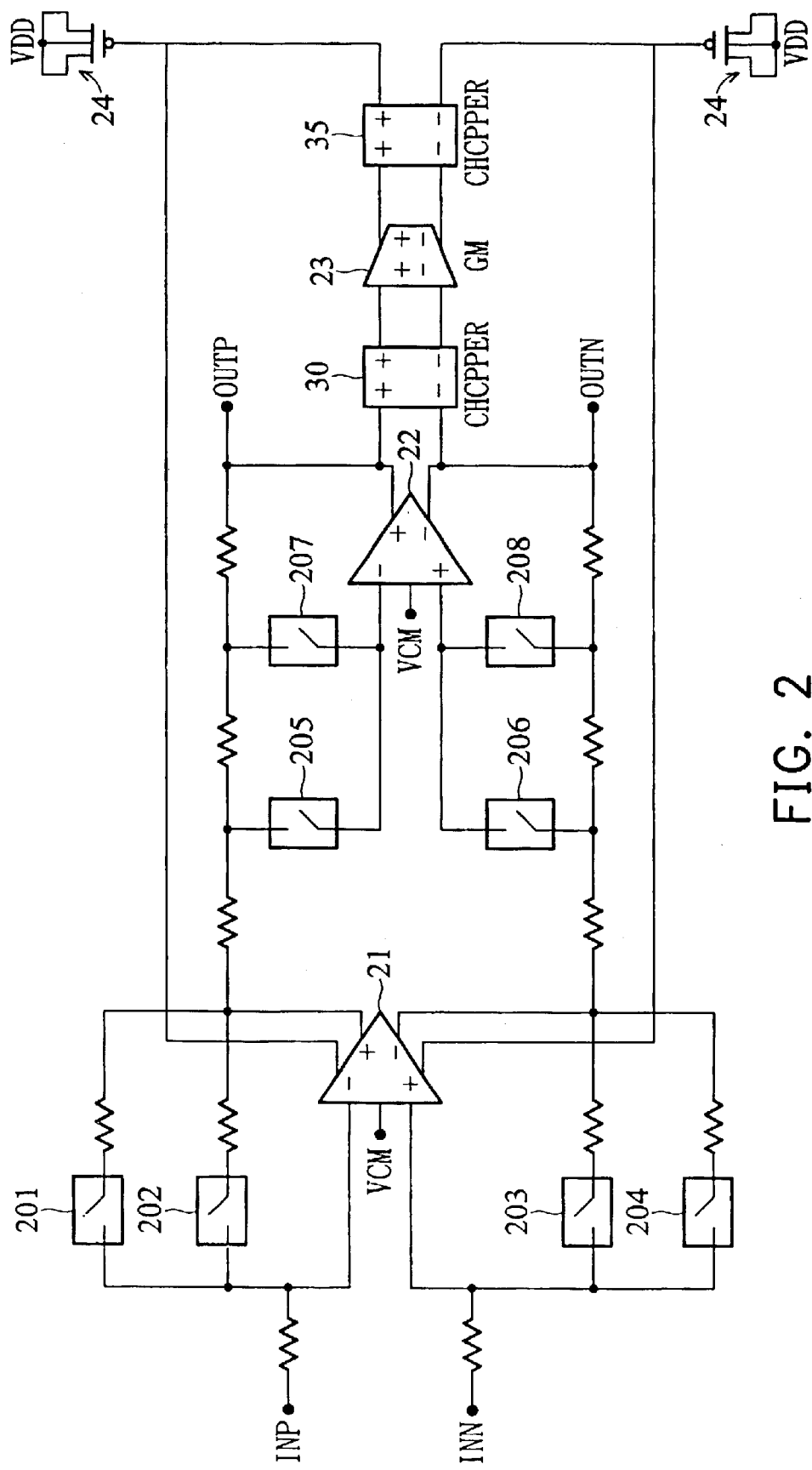
FIG. 2 is a schematic of a DC offset canceling circuit applied in the variable gain amplifier in the first embodiment.

FIG. 2 is a schematic of a DC offset canceling circuit applied in the variable gain amplifier in the first embodiment. The first chopper circuit 30 is inserted between the second amplifier 22 and the transconductance amplifier 23. The second chopper circuit 35 is inserted between the transconductance amplifier 23 and capacitor 24.

Figure 3:
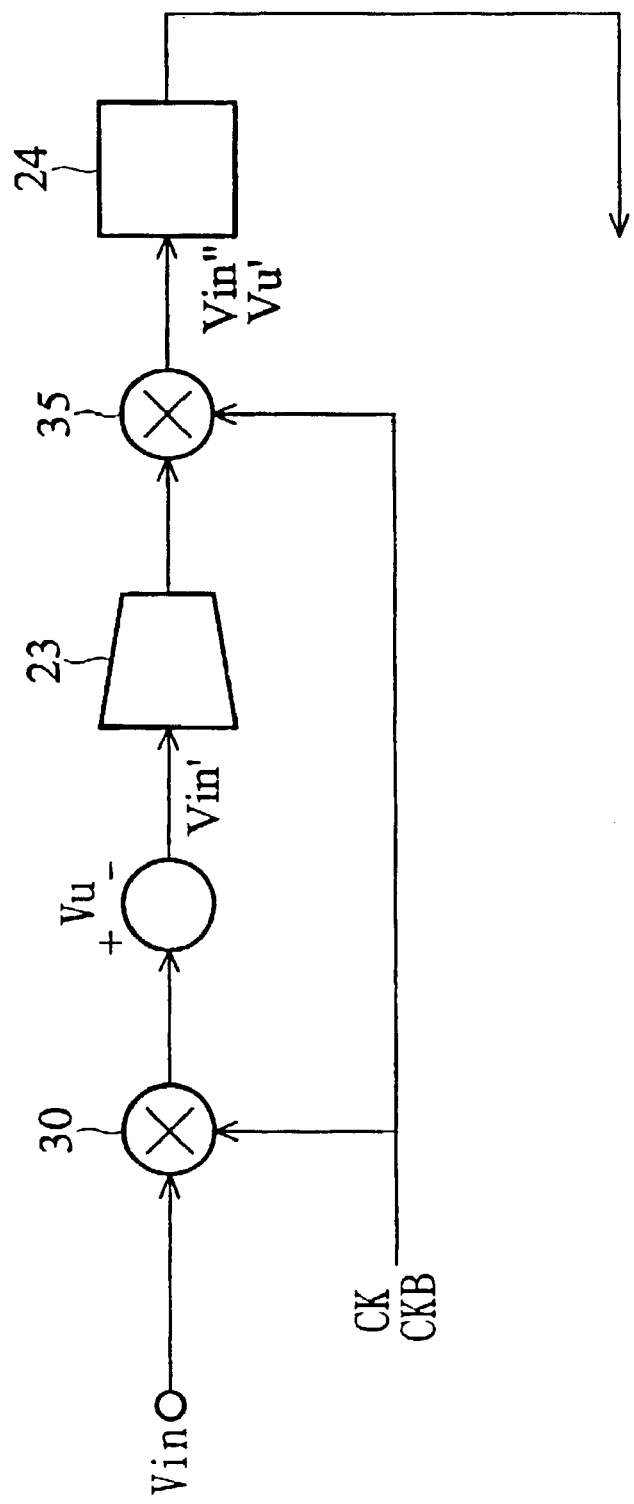
FIG. 3 is a block diagram of the chopper circuit applied in the variable gain amplifier.

FIG. 3 is a block diagram of the chopper circuit applied in the variable gain amplifier. The chopper circuit 30 and 35 are controlled by non-overlap clock signals CK and CKB. The undesired signal Vu represents the DC offset or the low frequency noise of the transconductance amplifier 23. The signal Vu' is an undesired signal modulated by the chopper circuit 35. FIGS. 4A~4D show the spectra of the desired and undesired signals. The desired signal Vin comes from the second amplifier 22. After the first chopper circuit 30, the desired signal Vin is shifted up to the signal Vin', at the clock frequency fc and the harmonic frequencies of the clock while the undesired signal Vu is unaffected. After the second chopper circuit 35, the signal Vin' is shifted back to the signal Vin" in the original band and the undesired signal Vu is shifted up to the undesired Vu', at the clock frequency fc and the harmonic frequencies of the clock.

The spectrum of the undesired signal Vu' has been folded back around the clock frequency fc. The clock frequency fc is much higher than the desired signal bandwidth, so the amount of the undesired signal Vu' in the desired signal bandwidth is greatly reduced. Since the undesired signal Vu includes the DC offset and 1/f noise of the transconductance amplifier 23, the influence of the undesired signal is mixed out the range of the desired signal.

Figure 5A:
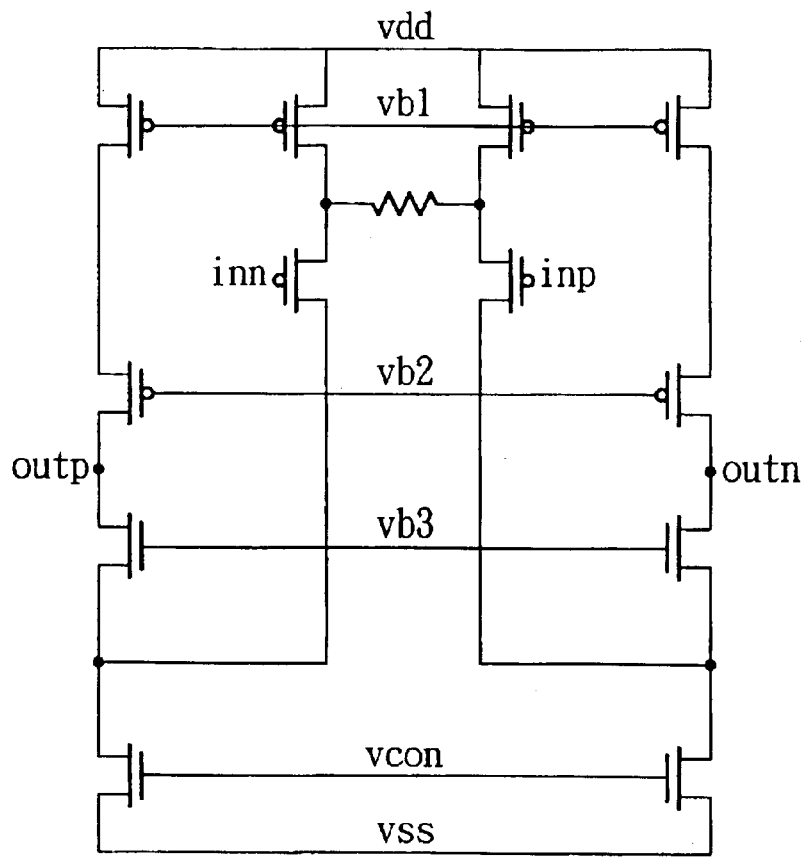
FIG. 5A is a schematic of the chopper circuit applied in the present invention.
Figure 5B:
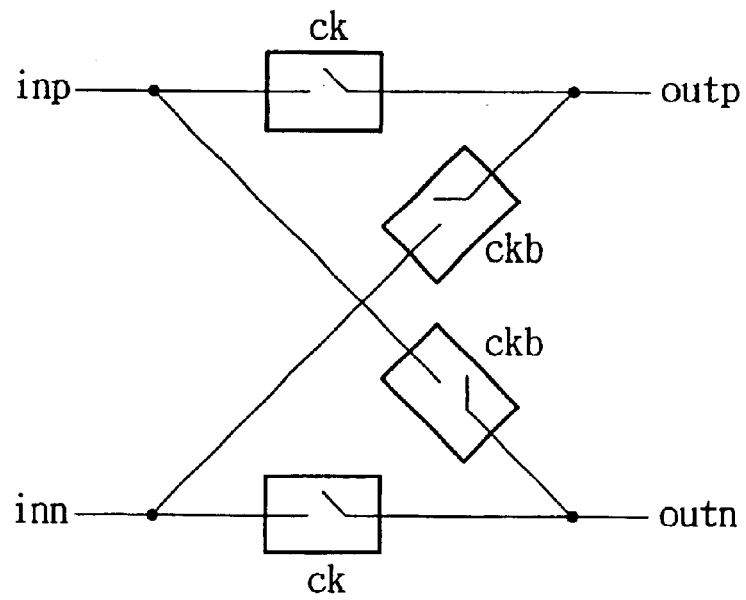
FIG. 5B is a schematic of the transconductance amplifier applied in the present invention.
Figure 6:
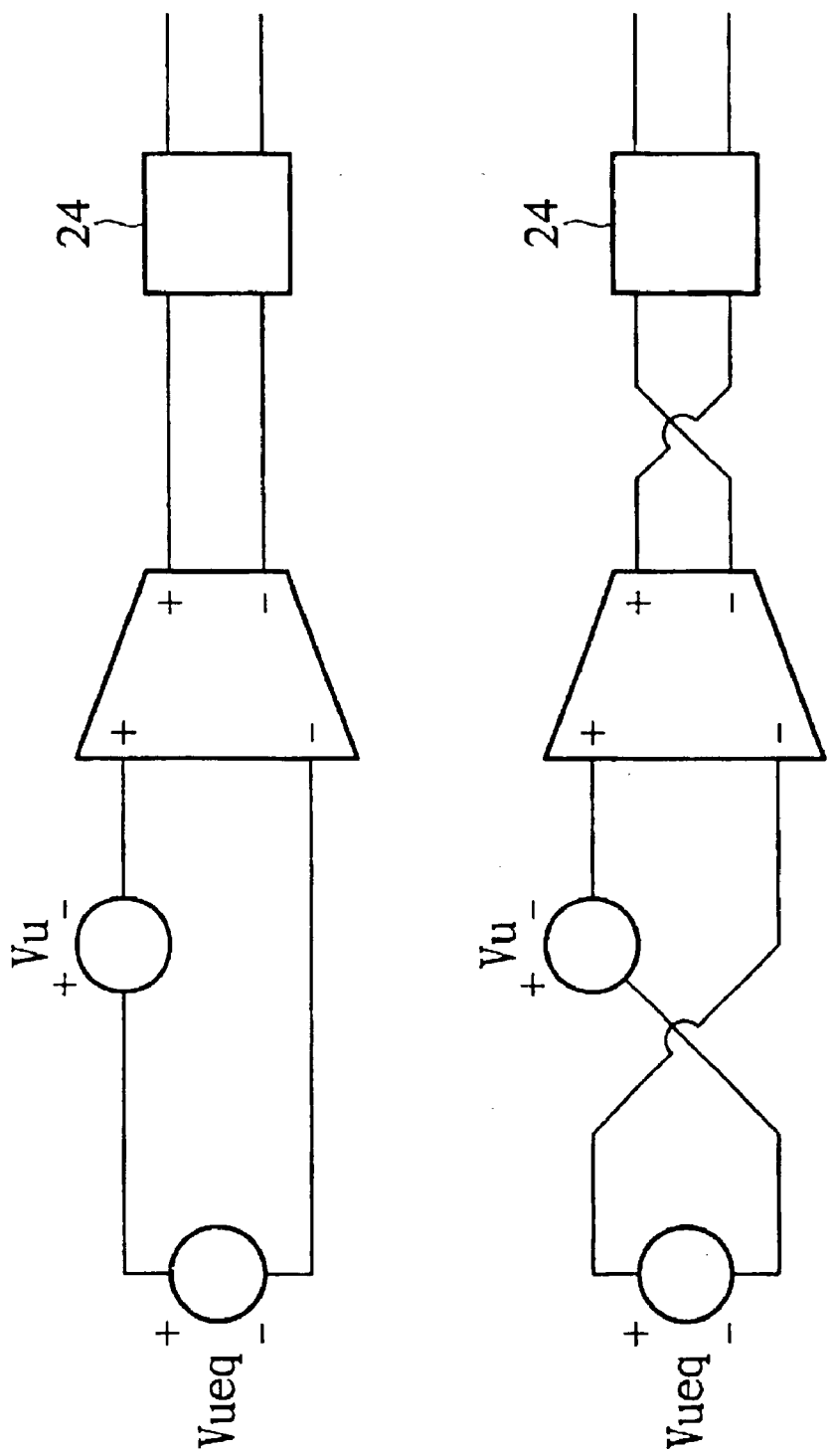
FIGS. 6A~6B shows the operation of the chopper circuits.

FIG. 5A is a schematic of the transconductance amplifier applied in the present invention. FIG. 5B is a schematic of the chopper circuit applied in the present invention. The first chopper circuit 30 and the second chopper circuit 35 are both implemented by two cross-coupled switches. FIGS. 6A~6B shows the operation of the chopper circuits. When CK is on and CKB is off, the first chopper circuit 30 and the second chopper circuit 35 are in the state shown in FIG. 6A. The equivalent undesired signal Vueq at the input of the transconductance amplifier 23 is equal to the undesired signal Vu. When CK is off and CKB is on, the first chopper circuit 30 and the second chopper circuit 35 are in the state shown in FIG. 6B. The equivalent signal Vueq is equal to the negative of the undesired signal −Vu. The average of the equivalent signal approximates zero, that is, the undesired signal Vu is averaged out.

Figure 7:
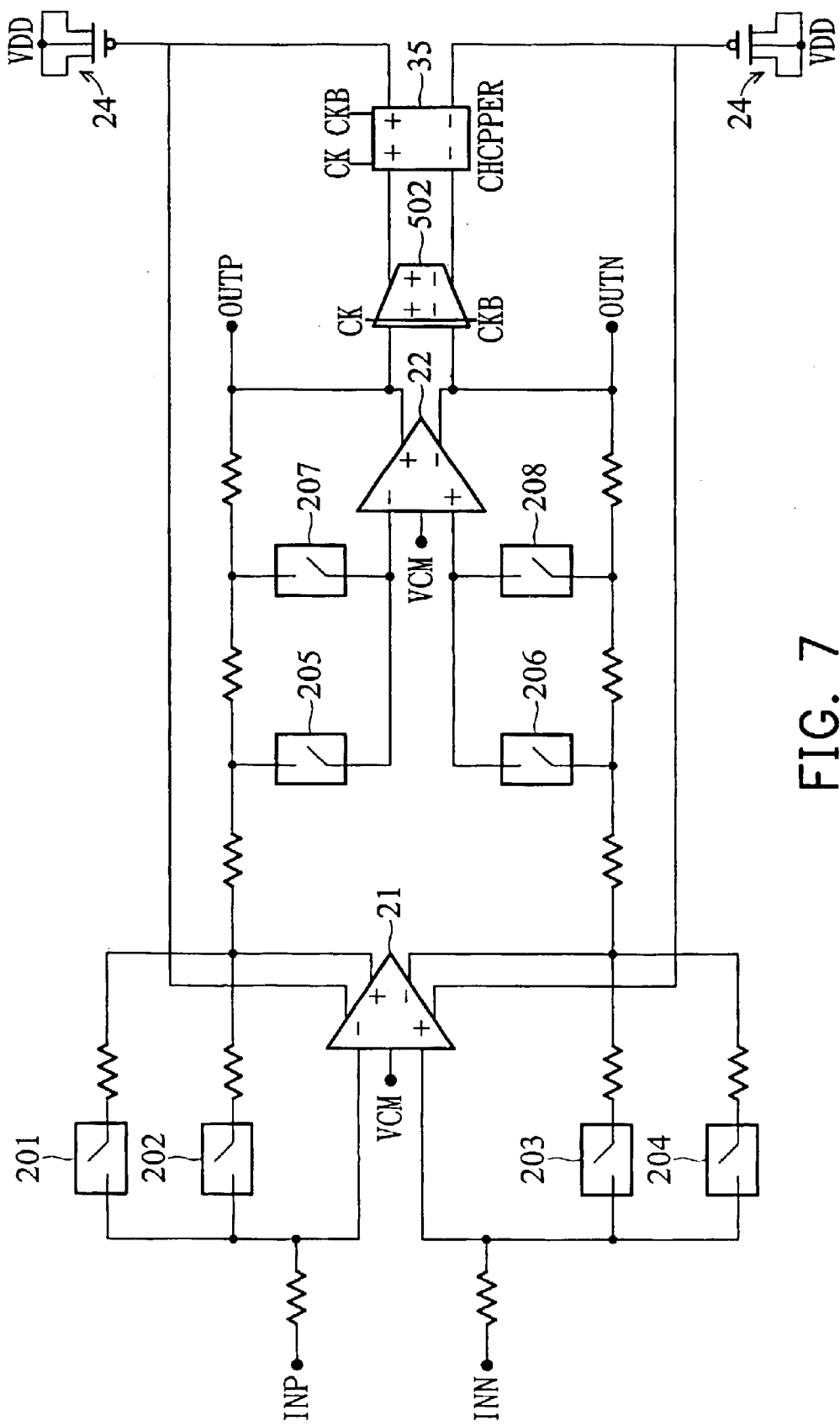
FIG. 7 is a schematic of a DC offset canceling circuit applied in the variable gain amplifier in the second embodiment.

FIG. 7 is a schematic of a DC offset canceling circuit applied in the variable gain amplifier in the second embodiment. The first chopper circuit 30 is merged into the input of the transconductance amplifier 23 to form the transconductance amplifier 502. The second chopper circuit 35 is inserted between output of the transconductance amplifier 502 and capacitor 24.

Figure 8:
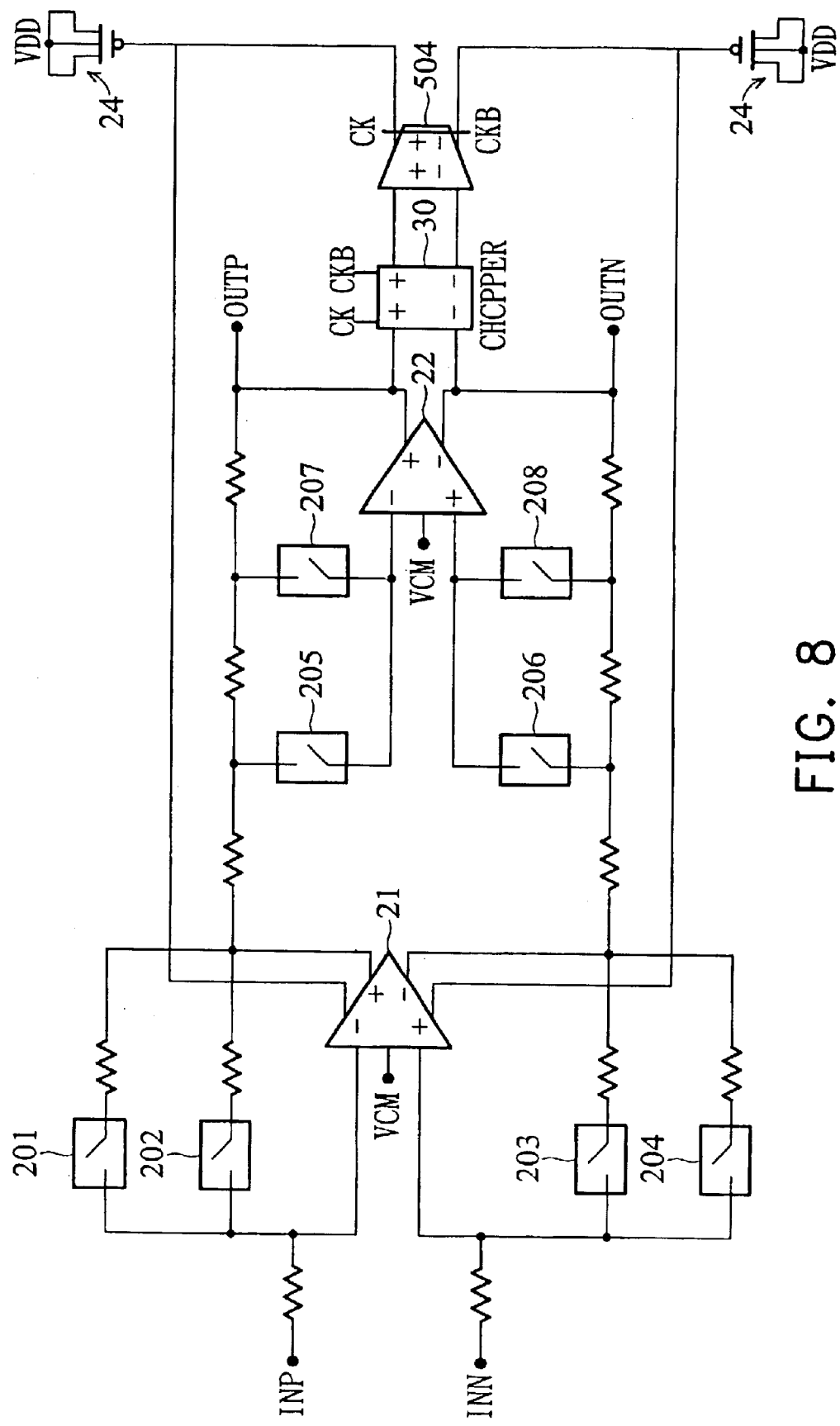
FIG. 8 is a schematic of a DC offset canceling circuit applied in the variable gain amplifier in the third embodiment.

FIG. 8 is a schematic of a DC offset canceling circuit applied in the variable gain amplifier in the third embodiment. The second chopper circuit 35 is merged into the output of the transconductance amplifier 23 to form the transconductance amplifier 504. The first chopper circuit 30 is inserted between the second amplifier 22 and input to the transconductance amplifier 504.

Figure 9:
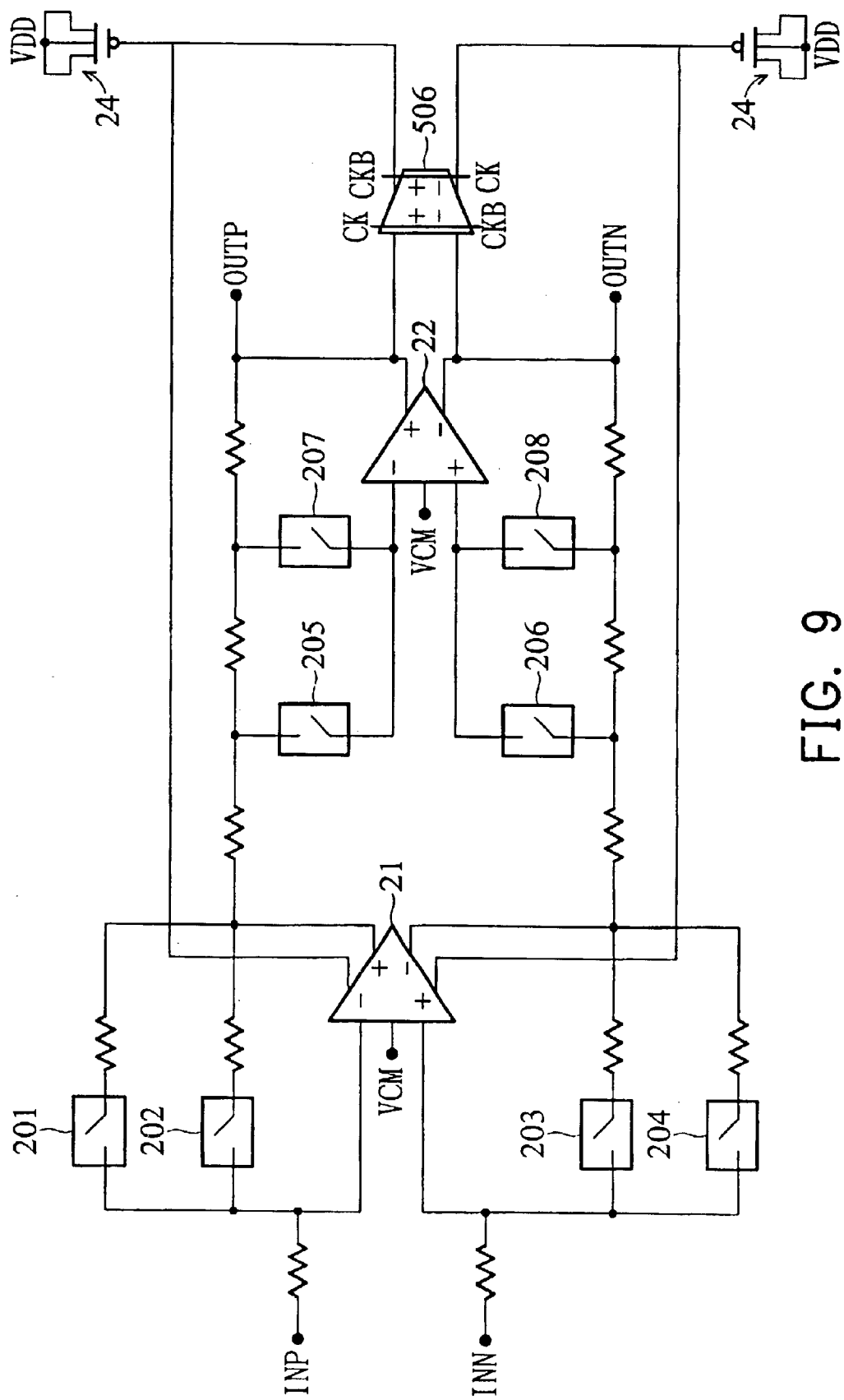
FIG. 9 is a schematic of a DC offset canceling circuit applied in the variable gain amplifier in the fourth embodiment.

FIG. 9 is a schematic of a DC offset canceling circuit applied in the variable gain amplifier in the fourth embodiment. The chopper circuit 30 and 35 are merged into input and output of the transconductance amplifier 23 to form the transconductance amplifier 506.

Although the present invention has been described in its preferred embodiments, it is not intended to limit the invention to the precise embodiments disclosed herein. Those who are skilled in this technology can still make various alterations and modifications without departing from the scope and spirit of this invention. Therefore, the scope of the present invention shall be defined and protected by the following claims and their equivalents.

What is claimed is:

1. A DC offset canceling circuit applied in a variable gain amplifier, comprising:
   a first chopper circuit having an input coupled to an output of the variable gain amplifier;
   a transconductance amplifier having an input coupled to an output of the first chopper circuit for transforming an input voltage to an output with a current based on a ratio;
   a second chopper circuit having an input coupled to the output of the transconductance amplifier;
   at least one internal capacitor coupled to an output of the second chopper circuit for generating a low-pass filtering function by working together with the transconductance amplifier; and
   an auxiliary differential pair at the input of the variable gain amplifier and coupled to the output of the transconductance amplifier.

2. A DC offset canceling circuit applied in a variable gain amplifier as claimed in claim 1, wherein the first chopper circuit is merged into the input of the transconductance amplifier.

3. A DC offset canceling circuit applied in a variable gain amplifier as claimed in claim 1, wherein the second chopper circuit is merged into the output of the transconductance amplifier.

4. A DC offset canceling circuit applied in a variable gain amplifier as claimed in claim 1, wherein the first chopper circuit is merged into the input of the transconductance amplifier and the second chopper circuit is merged into the output of the transconductance amplifier.

* * * * *